(12) United States Patent
Zhao et al.

(10) Patent No.: US 12,336,144 B2
(45) Date of Patent: Jun. 17, 2025

(54) IMMERSED LIQUID-COOLING SERVER AND WASTE HEAT RECOVERY SYSTEM THEREOF

(71) Applicant: SUZHOU METABRAIN INTELLIGENT TECHNOLOGY CO., LTD., Jiangsu (CN)

(72) Inventors: Mingyue Zhao, Jiangsu (CN); Siqiang Xu, Jiangsu (CN); Wei Gong, Jiangsu (CN); Yan Li, Jiangsu (CN)

(73) Assignee: SUZHOU METABRAIN INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/880,250

(22) PCT Filed: Sep. 27, 2023

(86) PCT No.: PCT/CN2023/122271
§ 371 (c)(1),
(2) Date: Dec. 30, 2024

(87) PCT Pub. No.: WO2024/148872
PCT Pub. Date: Jul. 18, 2024

(65) Prior Publication Data
US 2025/0169029 A1    May 22, 2025

(30) Foreign Application Priority Data
Jan. 9, 2023   (CN) .......................... 202310025096.6

(51) Int. Cl.
*H05K 7/20* (2006.01)

(52) U.S. Cl.
CPC ......... *H05K 7/203* (2013.01); *H05K 7/20663* (2013.01); *H05K 7/20781* (2013.01)

(58) Field of Classification Search
None
See application file for complete search history.

(56) References Cited

U.S. PATENT DOCUMENTS 8,345,423 B2 *   1/2013   Campbell ........... F28D 15/0233
                                                      257/714
10,966,349 B1 *  3/2021   Lau ........................... G01F 1/74
                        (Continued)

FOREIGN PATENT DOCUMENTS

CN        109952003 A      6/2019
CN        111352489 A      6/2020
                    (Continued)

*Primary Examiner* — Courtney L Smith
(74) *Attorney, Agent, or Firm* — IPro, PLLC

(57) ABSTRACT

A waste heat recovery system is provided and relates to the technical field of servers. The waste heat recovery system includes an immersion box body, an evaporation box body, a heat exchanger, a circulating pipe and a first driving assembly, wherein the immersion box body is filled with a single-phase coolant; the evaporation box body is filled with a two-phase coolant and is provided with an extending portion that extends into the immersion box body and is in contact with the single-phase coolant; a water inlet and a water outlet of the heat exchanger are respectively communicated to different positions of the immersion box body. Based on that the pumpless driven cold and heat circulation flow of a coolant are achieved, the energy consumption of the system is reduced, and the energy utilization efficiency and the environmental protection performance are improved.

20 Claims, 3 Drawing Sheets

(56) References Cited

U.S. PATENT DOCUMENTS

| | | | | |
|---|---|---|---|---|
| 11,026,344 | B2* | 6/2021 | Midgley | G06F 1/20 |
| 11,178,790 | B2* | 11/2021 | Aoki | H05K 7/20772 |
| 11,516,944 | B1 | 11/2022 | Gao | |
| 11,792,962 | B2* | 10/2023 | Alissa | H05K 7/203 |
| | | | | 361/699 |
| 11,800,683 | B2* | 10/2023 | Horng | H05K 7/203 |
| 11,889,658 | B2* | 1/2024 | Gao | H05K 7/20781 |
| 11,997,827 | B2* | 5/2024 | Alissa | H05K 7/20836 |
| 12,010,819 | B2* | 6/2024 | Heydari | H01M 8/04007 |
| 2018/0257949 | A1* | 9/2018 | Sbuelz | B01D 1/14 |
| 2022/0279674 | A1* | 9/2022 | Manousakis | H05K 7/20809 |
| 2022/0361378 | A1 | 11/2022 | Alissa et al. | |
| 2023/0084765 | A1* | 3/2023 | Gao | H05K 7/20254 |
| | | | | 361/679.53 |

FOREIGN PATENT DOCUMENTS

| | | | | | |
|---|---|---|---|---|---|
| CN | 112886093 | A | | 6/2021 | |
| CN | 114980648 | A | | 8/2022 | |
| CN | 115066157 | A | | 9/2022 | |
| CN | 217591420 | U | | 10/2022 | |
| CN | 115529781 | A | | 12/2022 | |
| CN | 115568193 | A | * | 1/2023 | H05K 7/20236 |
| CN | 115793819 | A | | 3/2023 | |

* cited by examiner

IMMERSED LIQUID-COOLING SERVER AND WASTE HEAT RECOVERY SYSTEM THEREOF

CROSS-REFERENCE TO RELATED APPLICATION

This application claims the priority of the Chinese Patent application filed on Jan. 9, 2023 before the China National Intellectual Property Administration with the application number of 202310025096.6, and the title of "IMMERSED LIQUID-COOLING SERVER AND WASTE HEAT RECOVERY SYSTEM THEREOF", which is incorporated herein in its entirety by reference.

FIELD

The present application relates to the technical field of servers, and more particular, to a waste heat recovery system. The present application further relates to an immersion liquid-cooling server.

BACKGROUND

With the development of electronic technology in China, more and more electronic devices have been widely used.

A server is an important component in the electronic devices and is a device providing a computing service. Since the server needs to respond to a service request and processes the service request, the server has an ability to undertake the service and guarantee the service. According to different types of services provided by the servers, the servers are classified into a file server, a database server, an application server, a world wide web (WEB) server, and the like. Main components of a server include a processor, a hard disk, a memory, a system bus, and the like. It is similar to a general-purpose computer architecture, but has high requirements for processing ability, stability, reliability, security, expandability, manageability, and other aspects.

In the age of big data, a large amount of information technology (IT) devices will be intensively placed in a chassis of data centers. These data centers include various types of servers, storages, switches, many cabinets, and other infrastructures. Each type of IT devices is composed of various hardware cards, such as a computing module, a storage module, a chassis and a fan module.

Compared with a traditional air-cooled server, an immersion liquid-cooling server has the following advantages due to storage nodes being completely immersed in the coolant: I. These servers have more extreme energy-saving performance: since the coolant is in contact with heating components such as the storage nodes, the heat exchange efficiency is higher, and comprehensive natural cooling may be achieved. II. The heat dissipation of the components is more uniform, due to the use of a full immersion method, an internal temperature field of the server is more uniform, and the reliability of the component is better guaranteed. III. The noise is lower: since all the components of the server are cooled by liquid cooling, there is no noise caused by fan operation. Meanwhile, the overall performance of the immersion servers is more stable and the energy consumption of the immersion servers is lower. At present, the immersion liquid-cooling servers have become a mainstream in the market of servers.

In the related art, the immersion cooling systems may be classified into single-phase immersion cooling systems and two-phase immersion cooling systems according to whether a coolant undergoes a phase change within a working temperature range of the system. A coolant of the single-phase immersion cooling system mainly brings away heat of heat generating devices through circulating convective heat transfer, and then transfers the heat to a cooling device through a heat exchanger. In the two-phase immersion cooling system, a coolant with a low boiling point is boiled and evaporated, and steam is condensed upon encountering cold and falls back. Compared with the single-phase immersion cooling system, the two-phase immersion cooling system has a larger heat transfer coefficient and a higher heat dissipation limit, but the cost of a two-phase coolant is about 10 times the cost of a single-phase coolant, and the two-phase coolant needs to be replenished every two years. Factors such as system design and cost are comprehensively considered. The single-phase immersion cooling systems are considered to be used in the industry at present.

However, the single-phase immersion cooling system needs to be provided with an additional pump to drive the coolant to enter the heat exchanger to exchange heat with the external cooling medium for cooling, thereby cold and heat circulation flow is achieved. The use of the pump not only increases the investment cost, but also consumes a certain amount of electricity. As a result, the energy consumption is increased, and power usage effectiveness (PUE, which is a ratio of all energy consumed by the data center to energy consumed by an IT load) is high. Moreover, during the entire heat exchange, a large amount of heat energy generated by the electronic components of the server will be wasted. The heat needs to be additionally processed by external refrigeration devices, resulting in increased energy consumption.

SUMMARY

The present application aims to provide a waste heat recovery system. Heat of a server may be used as kinetic energy. Based on that the pumpless driven cold and heat circulation flow of a coolant is achieved, the energy consumption of the system is reduced, and the energy utilization efficiency and the environmental protection performance are improved. The present application further aims to provide an immersion liquid-cooling server.

To solve the above technical problems, a waste heat recovery system is provided by the present application, which includes an immersion box body, an evaporation box body, a heat exchanger, a circulating pipe, and a first driving assembly;

the immersion box body is filled with a single-phase coolant for immersed mounting of server nodes;

the evaporation box body is filled with a two-phase coolant capable of generating gas-liquid phase change, and the evaporation box body is provided with an extending portion; and the extending portion extends into the immersion box body and is in contact with the single-phase coolant;

a water inlet of the heat exchanger and a water outlet of the heat exchanger are respectively communicated to different positions of the immersion box body to dissipate heat from the single-phase coolant;

a pipe orifice of one end of the circulating pipe is communicated to a bottom of the evaporation box body, and a pipe orifice of the other end of the circulating pipe is communicated to a top of the evaporation box body;

the first driving assembly includes a first driving impeller mounted in the circulating pipe, a first driven impeller mounted in a pipeline between the water inlet of the heat exchanger and the immersion box body, and a first transmission component connected between the first driving impeller and the first driven impeller.

In some embodiments, a plurality of mounting partitions that extend vertically are vertically arranged in the immersion box body; and the server nodes are mounted in a vertical posture on the mounting partitions.

In some embodiments, each mounting partition is provided with a guiding sliding rail, and the server nodes are slidably mounted on the guiding sliding rails.

In some embodiments, both the immersion box body and the evaporation box body are rectangular box bodies.

In some embodiments, the evaporation box body is mounted on a top surface of the immersion box body, and the extending portion is arranged on a top plate of the immersion box body in a penetrating manner and extends to be in contact with a liquid level region of the single-phase coolant in the immersion box body.

In some embodiments, the evaporation box body is mounted on a side surface of the immersion box body, and the extending portion is arranged on a side wall of the immersion box body in a penetrating manner and extends to be in contact with a middle region of the single-phase coolant in the immersion box body.

In some embodiments, the evaporation box body is provided with a plurality of extending portions, and the extending portions are uniformly distributed on a mounting surface of the evaporation box body.

In some embodiments, the extending portions are U-shaped pipes or straight pipes.

In some embodiments, the water inlet of the heat exchanger is communicated to a top of the immersion box body, and the water outlet of the heat exchanger is communicated to a bottom of the immersion box body.

In some embodiments, the water inlet of the heat exchanger is communicated to the top of the immersion box body through a water inlet pipeline, and the first driven impeller is mounted in the water inlet pipeline; and the water outlet of the heat exchanger is communicated to the bottom of the immersion box body through a water outlet pipeline.

In some embodiments, a bent coil is arranged in the heat exchanger; one end of the bent coil is communicated to the water inlet pipeline; and the other end of the bent coil is communicated to the water outlet pipeline.

In some embodiments, the heat exchanger is further communicated with a cooling medium inlet pipe and a cooling medium outlet pipe to allow an external cooling medium to flow through the heat exchanger and dissipate heat from the bent coil.

In some embodiments, the waste heat recovery system further includes a second driving assembly, wherein the second driving assembly includes a second driving impeller mounted in the circulating pipe, a second driven impeller mounted in the cooling medium inlet pipe, and a second transmission component connected between the second driving impeller and the second driven impeller.

In some embodiments, the first transmission component is a first transmission shaft; the first driving impeller is connected to one end of the first transmission shaft; and the first driven impeller is connected to the other end of the first transmission shaft.

In some embodiments, the second transmission component is a second transmission shaft; the second driving impeller is connected to one end of the second transmission shaft; and the second driven impeller is connected to the other end of the second transmission shaft.

In some embodiments, a circulating branch pipe is connected in parallel to the circulating pipe, and the second driving impeller is mounted in the circulating branch pipe.

In some embodiments, the waste heat recovery system further includes a condenser mounted in the evaporation box body to condense a part of a gaseous two-phase coolant when a gas pressure of gas generated by evaporation of the two-phase coolant exceeds a safety threshold.

In some embodiments, a water inlet of the condenser is communicated to the cooling medium inlet pipe through a condensate water inlet pipe, and a water outlet of the condenser is communicated to the cooling medium outlet pipe through a condensate water return pipe.

In some embodiments, the waste heat recovery system further includes a pressure sensor configured to detect a gas pressure inside the evaporation box body, and a controller that is in signal connection to the pressure sensor, wherein the condensate water inlet pipe is provided with an electromagnetic throttle valve that is in signal connection to the controller to control a throttle opening degree of the electromagnetic throttle valve according to a feedback result of the pressure sensor.

In some embodiments, the waste heat recovery system further includes a first liquid level sensor mounted in the immersion box body, wherein the first liquid level sensor is in signal connection to the controller to trigger an alarm instruction when a detection value of the first liquid level sensor is less than a safety threshold.

In some embodiments, the waste heat recovery system further includes a first electromagnetic replenishment valve communicated to the immersion box body, wherein the first electromagnetic replenishment valve is in signal connection to the controller for opening the first electromagnetic replenishment valve when the detection value of the first liquid level sensor is less than the safety threshold.

In some embodiments, the waste heat recovery system further includes a second liquid level sensor mounted in the evaporation box body, wherein the second liquid level sensor is in signal connection to the controller to trigger an alarm instruction when a detection value of the second liquid level sensor is less than a safety threshold.

In some embodiments, the waste heat recovery system further includes a second electromagnetic replenishment valve communicated to the evaporation box body, wherein the second electromagnetic replenishment valve is in signal connection to the controller for opening the second electromagnetic replenishment valve when the detection value of the second liquid level sensor is less than the safety threshold.

In some embodiments, pipe orifices at two ends of the circulating pipe and the evaporation box body are communicated to each other through quick-release connectors; the condensate water inlet pipe and the water inlet of the condenser are communicated to each other through a quick-release connector; the condensate water inlet pipe and the cooling medium inlet pipe are communicated to each other through a quick-release connector; the condensate water return pipe and the water outlet of the condenser are communicated to each other through a quick-release connector; and the condensate water return pipe and the cooling medium outlet pipe are communicated to each other through a quick-release connector.

An immersion liquid-cooling server is further provided by the present application, the immersion liquid-cooling server includes a plurality of server nodes and further includes the waste heat recovery system according to any one of the embodiments stated above.

The waste heat recovery system provided by the present application mainly includes an immersion box body, an evaporation box body, a heat exchanger, a circulating pipe and a first driving assembly. The immersion box body is filled with a certain amount of single-phase coolant and is mainly used for mounting server nodes, to completely immerse the server nodes through the single-phase coolant, and to achieve immersed liquid cooling and heat dissipation on the server nodes. This single-phase coolant usually does not generate a heat absorption or release phase change, and always remains in a liquid state. The evaporation box body is filled with a certain amount of two-phase coolant. The two-phase coolant has a low boiling point and may easily undergo a gas-liquid reversible phase change through the method of heat absorption or the method of heat release. An extending portion is arranged on the evaporation box body. The extending portion extends into the immersion box body, and remains to be in contact with the single-phase coolant in the immersion box body, so that the two-phase coolant in the extending portion may exchange heat with the single-phase coolant that absorbs the heat of the server nodes. A water inlet of the heat exchanger is communicated to the immersion box body, and a water outlet of the heat exchanger is also communicated to different positions of the immersion box body and is mainly configured to export the single-phase coolant inside the immersion box body, to achieve circulation flow of the single-phase coolant between the immersion box body and the heat exchanger, and dissipate, in the heat exchanger, the heat of the single-phase coolant that has absorbed the heat of the server nodes. The heat is transferred to an external cooling medium, so that the single-phase coolant becomes cold again and flows back into the immersion box body. The circulating pipe is connected to the immersion box body as a whole. A pipe orifice of one end of the circulating pipe is communicated to a bottom of the evaporation box body, and a pipe orifice of the other end of the circulating pipe is communicated to a top of the evaporation box body. After the two-phase coolant in the immersion box body absorbs the heat of the single-phase coolant, the two-phase coolant evaporates and undergoes phase change into gaseous two-phase coolant that fills the evaporation box body. Then, the gaseous two-phase coolant enters the circulating pipe from the pipe orifice of the other end of the circulating pipe, and flows along the circulating pipe. Finally, the gaseous two-phase coolant is dissolved again in the aqueous two-phase coolant through the pipe orifice of one end of the circulating pipe. The first driving assembly is of a split structure, mainly including a first driving impeller, a first driven impeller, and a first transmission component. The first driving impeller is mounted in the circulating pipe and maintains a freedom of rotation motion. When the gaseous two-phase coolant flows through the circulating pipe, the gaseous two-phase coolant forms a wind driving effect on the first driving impeller, to drive the first driving impeller to rotate. The first driven impeller is mounted in a pipeline between the water inlet of the heat exchanger and the immersion box body, and maintains a freedom of rotation motion too. The first transmission component is connected between the first driving impeller and the first driven impeller, and is mainly configured to transfer the rotation motion of the first driving impeller to the first driven impeller, so as to drive the first driven impeller to rotate synchronously when the first driving impeller rotates. Since the first driven impeller is mounted in the pipeline between the water inlet of the heat exchanger and the immersion box body, the rotation motion of the first driven impeller achieves a pumping driving effect on the single-phase coolant in the immersion box body, to drive the single-phase coolant to continuously circulates and flow between the immersion box body and the heat exchanger through the first driven impeller.

In summary, according to the waste heat recovery system provided by the present application, the single-phase coolant is first used to absorb the heat generated by the server nodes during operation, and the two-phase coolant is then used to absorb some of the heat of the single-phase coolant and evaporates into gas. The first driving impeller is driven to rotate by flowing of the gas in the circulating pipe, and then the first driven impeller is driven to rotate through the first transmission component. Finally, the first driven impeller is used to achieve a pumping effect on single-phase coolant. Therefore, the heat of the server may be used as kinetic energy to reduce the energy consumption of the system and improve the energy utilization efficiency and the environmental protection performance based on that the pumpless driven cold and heat circulation flow of the coolant are achieved.

The immersion liquid-cooling server provided by the present application mainly includes a plurality of server nodes and a waste heat recovery system. The waste heat recovery system is the same as the above-mentioned waste heat recovery system. Therefore, the immersion liquid-cooling server provided by the present application obviously has the same beneficial effects.

BRIEF DESCRIPTION OF THE DRAWINGS

In order to describe the technical solutions in the embodiments of the present application or in the related art more clearly, the drawings for describing the embodiments or the related art are briefly introduced below. Apparently, the drawings in the following description are merely the embodiments of the present application, and a person skilled in the art may also obtain other drawings according to the provided drawings without creative efforts.

Wherein, in FIG. 1 to FIG. 3, elements and reference numbers are as follows:

a: server node;

1: immersion box body; 2: evaporation box body; 3: heat exchanger; 4: circulating pipe; 5: first driving assembly; 6: second driving assembly; 7: condenser; 8: pressure sensor; 9: controller; 10: electromagnetic throttle valve; 11: first liquid level sensor; 12: first electromagnetic replenishment valve; 13: second liquid level sensor; 14: second electromagnetic replenishment valve; 15: quick-release connector;

101: mounting partition plate;

21: extending portion;

31: water inlet pipeline; 32: water outlet pipeline; 33: bent coil; 34: cooling medium inlet pipe; 35: cooling medium outlet pipe;

41: circulating branch pipe;

51: first driving impeller; 52: first driven impeller; 53: first transmission component;

61: second driving impeller; 62: second driven impeller; 63: second transmission component;

71: condensate water inlet pipe; and 72: condensate water return pipe.

DETAILED DESCRIPTION

The technical solutions in the embodiments of the present application are clearly and completely described in the following with reference to the drawings in the embodiments of the present application. Apparently, the described embodiments are merely some rather than all the embodiments of the present application. All other embodiments obtained by a person skilled in the art based on the embodiments of the present application without making creative efforts shall fall within the protection scope of the present application.

Figure 1:
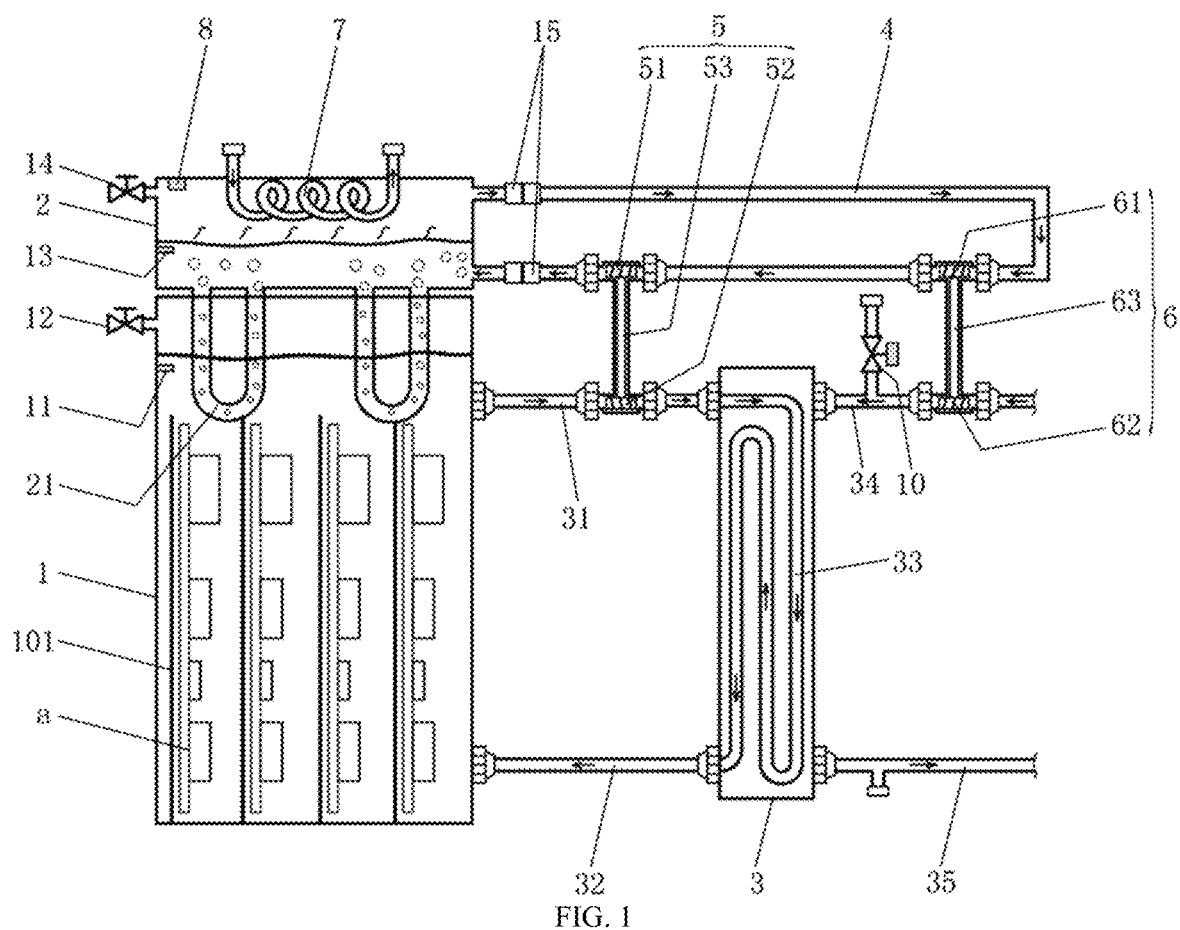
FIG. 1 is a schematic diagram of an entire structure of a waste heat recovery system according to an implementation of by the present application.

Referring to FIG. 1, FIG. 1 is a schematic diagram of an entire structure of a waste heat recovery system according to an implementation of by the present application.

In an implementation provided by the present application, the waste heat recovery system mainly includes an immersion box body 1, an evaporation box body 2, a heat exchanger 3, a circulating pipe 4, and a first driving assembly 5.

The immersion box body 1 is filled with a single-phase coolant and is mainly used for mounting server nodes a, so as to completely immerse the server nodes a through the single-phase coolant and to achieve immersed liquid cooling and heat dissipation on the server nodes a. This single-phase coolant usually does not generate heat absorption or release phase change, and always remains in a liquid state.

Generally, an electronic fluorinated solution with a high boiling point, such as FC-3283, FC-40, and FC-43 may be used as the single-phase coolant.

The evaporation box body 2 is filled with a two-phase coolant. The two-phase coolant has a low boiling point and may easily undergo gas-liquid reversible phase change through the method of heat absorption or the method of heat release. An extending portion 21 is arranged on the evaporation box body 2. The extending portion 21 extends into the immersion box body 1, and remains to be in contact with the single-phase coolant in the immersion box body 1, so that the two-phase coolant in the extending portion 21 may exchange heat with the single-phase coolant that absorbs the heat of the server nodes a.

Generally, an electronic fluorinated solution with a low boiling point, such as FC-72, Novec™ 7100, and Novec™ 649 may be used as the two-phase coolant.

A water inlet of the heat exchanger 3 and a water outlet of the heat exchanger 3 are communicated to different positions of the immersion box body 1. The heat exchanger 3 is mainly configured to export the single-phase coolant inside the immersion box body 1, to achieve circulation flow of the single-phase coolant between the immersion box body 1 and the heat exchanger 3, and dissipate, in the heat exchanger 3, the heat of the single-phase coolant that has absorbed the heat of the server nodes a. The heat is transferred to an external cooling medium, so that the single-phase coolant becomes cold again and flows back into the immersion box body 1.

The entire circulating pipe 4 is connected to the immersion box body 1. A pipe orifice of one end of the circulating pipe 4 is communicated to a bottom of the evaporation box body 2, and a pipe orifice of the other end of the circulating pipe 4 is communicated to a top of the evaporation box body 2. After the two-phase coolant in the immersion box body 1 absorbs the heat of the single-phase coolant, the coolant evaporates and undergoes phase change into gaseous two-phase coolant that fills the evaporation box body 2. Then, the gaseous two-phase coolant enters the circulating pipe 4 from the pipe orifice of the other end of the circulating pipe 4, and flows along the circulating pipe 4. Finally, the gaseous two-phase coolant is dissolved again in the aqueous two-phase coolant through the pipe orifice of one end of the circulating pipe 4.

The first driving assembly 5 is of a split structure, mainly including a first driving impeller 51, a first driven impeller 52 and a first transmission component 53. The first driving impeller 51 is mounted in the circulating pipe 4 and maintains a freedom of rotation motion. When the gaseous two-phase coolant flows through the circulating pipe 4, the gaseous two-phase coolant forms a wind driving effect on the first driving impeller 51, to drive the first driving impeller 51 to rotate. The first driven impeller 52 is mounted in a pipeline between the water inlet of the heat exchanger 3 and the immersion box body 1, and maintains a freedom of rotation motion too. The first transmission component 53 is connected between the first driving impeller 51 and the first driven impeller 52, and is mainly configured to transfer the rotation motion of the first driving impeller 51 to the first driven impeller 52, so as to drive the first driven impeller 52 to rotate synchronously when the first driving impeller 51 rotates. Since the first driven impeller 52 is mounted in the pipeline between the water inlet of the heat exchanger 3 and the immersion box body 1, the rotation motion of the first driven impeller 52 achieves a pumping driving effect on the single-phase coolant in the immersion box body 1, to drive the single-phase coolant to continuously circulate and flow between the immersion box body 1 and the heat exchanger 3 through the first driven impeller 52.

In this way, according to the waste heat recovery system provided by this embodiment, the single-phase coolant is first used to absorb the heat generated by the server nodes a during operation, and then the two-phase coolant is used to absorb some of the heat of the single-phase coolant and evaporates into gas. The first driving impeller 51 is driven to rotate by flowing of the gas in the circulating pipe 4, and then the first driven impeller 52 is driven to rotate through the first transmission component 53. Finally, the first driven impeller 52 is used to achieve a pumping effect on single-phase coolant. Therefore, the heat of the server may be used as kinetic energy to reduce the energy consumption of the system and improve the energy utilization efficiency and the environmental protection performance based on that the pumpless driven cold and heat circulation flow of the coolant are achieved.

In an embodiment of the immersion box body 1, considering that a plurality of server nodes a are usually simultaneously mounted in the immersion box body 1, and the server nodes a cooperative work. To facilitate the mounting of the plurality of server nodes a in the immersion box body 1, in the present embodiment, a plurality of mounting partitions 101 are arranged in the immersion box body 1 to respectively mount the server nodes a on the corresponding mounting partitions 101. The mounting partitions 101 are vertically mounted in a vertical posture in the immersion box body 1. Four to eight or more mounting partitions may be mounted simultaneously, and the mounting partitions 101 extend in a vertical direction. In this way, the server nodes a may be respectively mounted in the vertical posture on the mounting partitions 101, thereby vertical mounting of the server nodes a in the immersion box body 1 is achieved. Generally, two adjacent mounting partitions 101 may be spaced at the same preset distance from each other to provide an enough space to mount the server nodes a.

Further, in order to facilitate to achieve the assembling and disassembling of the server nodes a in the immersion box body 1, in the present embodiment, each mounting partition 101 is provided with a guiding sliding rail. The guiding sliding rails extend in length directions of the mounting partitions 101, and the server nodes a are slidably mounted on the guiding sliding rails to achieve slidably mounting between the server nodes a and the mounting partitions 101 through the guiding sliding rails. In addition, the server nodes a may be conveniently mounted in and removed from the immersion box body 1 through vertical rise and fall movements on the guiding sliding rails. In actual operations, devices such as a crane is usually used to lift top ends of the server nodes a from the immersion box body 1.

Of course, the server nodes a may also be vertically distributed in a hierarchical manner in the immersion box body 1. This is similar to a traditional server cabinet type mounting manner.

Considering that the server nodes a are usually rectangular, in order to facilitate the mounting of the server nodes a, in the present embodiment, the entire immersion box body 1 is of a rectangular structure, namely, a rectangular box body, to regularly install the server nodes a and avoid the presence of a mounting blind region. Based on the same consideration, in the present embodiment, in order to facilitate the connection between the evaporation box body 2 and the immersion box body 1, or the mounting of the evaporation box body 2 on the immersion box body 1, the evaporation box body 2 is also of a rectangular structure, namely, a rectangular box body.

Of course, the shapes and structures of the immersion box body 1 and the evaporation box body 2 are not fixed, and box bodies in other shapes such as cylindrical box bodies and polygonal box bodies may also be used.

Considering that the server nodes a are immersed in the single-phase coolant in the immersion box body 1, after the server nodes a generate heat during operation, the single-phase coolant that is in direct contact with the server nodes a will absorb the heat dispersed by the server nodes a. Due to an effect of a temperature difference, convection occurs inside the single-phase coolant, and the single-phase coolant with a higher temperature moves to the upper layer, thereby the heat generated by the server nodes a is transferred into the single-phase coolant at the upper layer. In view of this, in order to accelerate the heat exchange efficiency between the two-phase coolant and the single-phase coolant, in the present embodiment, the evaporation box body 2 is mounted on a top surface of the immersion box body 1, and the evaporation box body 2 and the immersion box body 1 are mounted in a vertically stacked way. Furthermore, the extending portion 21 arranged on the evaporation box body 2 is arranged on a bottom surface of the evaporation box body 2, and the extending portion 21 is arranged in a penetrating manner at a top plate of the immersion box body 1 from top to bottom and extends into the immersion box body 1 at a certain depth to maintain being in contact with the liquid level region of the single-phase coolant accommodated in the immersion box body 1. In this way, the single-phase coolant with a high temperature will continuously rise to the liquid level region under the action of convection, and will exchange heat with the two-phase coolant in the extending portion 21 at the liquid level region. Some of the heat of the server nodes a is transferred to the two-phase coolant, causing the two-phase coolant to undergo evaporation phase change to form gas.

Of course, the evaporation box body 2 is not necessarily only mounted on the top surface of the immersion box body 1. For example, in another embodiment, the evaporation box body 2 is mounted on a side surface of the immersion box body 1, the evaporation box body 2 and the immersion box body 1 are horizontally distributed side by side. At this moment, the extending portion 21 is arranged on a side surface of the evaporation box body 2 and is disposed on opposite side walls of the immersion box body 1 in a penetrating manner along a horizontal direction, extends to a middle region of the immersion box body 1 and maintains being in contact with the middle region of the single-phase coolant in the immersion box body 1. In this way, as the single-phase coolant with the high temperature will continuously rise under the action of convection, the single-phase coolant will be in contact with the extending portion 21 during the rising, thereby heat exchange between the single-phase coolant and the two-phase coolant is achieved.

In addition, in order to facilitate the extending of the extending portion 21 into the immersion box body 1, in the present embodiment, considering that the single-phase coolant in the immersion box body 1 will not have evaporation phase change, a requirement for sealing is not high. It is only necessary to ensure that external impurities will not directly enter the single-phase coolant. Therefore, when the evaporation box body 2 is mounted on the top surface of the immersion box body 1, it is only necessary to provide a plurality of mounting holes in the top plate of the immersion box body 1, and the extending portion 21 may enter the immersion box body 1 by passing through the mounting holes. As for a case that the evaporation box body 2 is mounted on other side surfaces of the immersion box body 1, when mounting holes are disposed in a side wall of the immersion box body 1, sealing needs to be considered to prevent leakage of the single-phase coolant. Generally, a sealing measure such as a sealing ring may be mounted at a connection plane between the mounting holes and the extending portion 21.

In an embodiment regarding the extending portion 21, the extending portion 21 may be a U-shaped tube. The U-shaped portion extends into the single-phase coolant to enlarge a contact area with the single-phase coolant. In this way, after the two-phase coolant exchanges heat with the single-phase coolant in the U-shaped tube, the gas generated by the phase change will float upwards along the U-shaped tube in the form of bubbles.

Of course, the extending portion 21 may also be in the form of a straight tube, an arc-shaped tube, a curved tube, and the like. Its solid shape is not fixed. It is the best that the extending portion has the larger surface area.

Meanwhile, in order to improve the heat exchange efficiency between the two-phase coolant and the single-phase coolant, in the present embodiment, a plurality of, e.g. two to eight, extending portions 21 are simultaneously disposed, and the extending portions 21 are uniformly distributed on the mounting surface (e.g. the bottom surface or the side surface) of the evaporation box body 2. In this way, the plurality of extending portions 21 are simultaneously in contact with and exchange heat with the single-phase coolant in different regions, which may not only increase a heat exchange area between the single-phase coolant and the two-phase coolant, but also enlarge a heat exchange range, so as to balance the heat exchange efficiency between the single-phase coolant and the two-phase coolant in different regions as much as possible. On the one hand, temperature differences of different regions of the single-phase coolant are kept equilibrium. On the other hand, gas is generated simultaneously at various parts of the evaporation box body 2, which is conducive to balancing the gas pressure.

Moreover, in the present embodiment, the extending portion 21 is made of a metal material with good thermal conductivity, such as iron, iron alloy, aluminum, aluminum alloy, copper, and copper alloy, to further improve the heat exchange efficiency and the heat conduction efficiency between the single-phase coolant and the two-phase coolant.

In addition, an extending length of the extending portion 21 in the immersion box body 1 needs to be designed, it not only needs to ensure that the extending portion 21 needs to be always immersed in the single-phase coolant under a normal liquid level of the immersion box body 1, but also since the server nodes a are usually mounted in the vertical posture in the immersion box body 1, it is needed to ensure that interference or collision with the top ends of the server nodes a are avoided.

In an embodiment related to the heat exchanger 3, as previously known, the water inlet of the heat exchanger 3 and the water outlet of the heat exchanger 3 are respectively connected to different positions of the immersion box body 1 to achieve the circulation flow of the single-phase coolant between the immersion box body 1 and the heat exchanger 3. In the present embodiment, the water inlet of the heat exchanger 3 is communicated to a top region of the immersion box body 1, and the water outlet of the heat exchanger 3 is communicated to a bottom region of the immersion box body 1. In this way, on the one hand, the single-phase coolant with a high temperature will continuously rise to the liquid level region under the action of convection. Therefore, the single-phase coolant with the high temperature may conveniently enter the water inlet of the heat exchanger 3, thereby the single-phase coolant that has absorbed the heat is quickly exported. On the other hand, since there is a certain height difference between the water inlet of the heat exchanger 3 and the water outlet of the heat exchanger 3, the gravity potential energy of the single-phase coolant itself may also be used to accelerate the circulation flow based on that the first driven impeller 52 is used as a pumping power source.

Of course, the communication positions of the water inlet and water outlet of the heat exchanger 3 on immersion box body 1 are not limited to the top and bottom of the immersion box body 1. Other positions may all be used: for example, a middle region of the immersion box body 1 communicated to the water inlet, a bottom area of the immersion box body 1 communicated to the water outlet, or a top region of the immersion box body 1 communicated to the water inlet, and the middle region of the immersion box body 1 communicated to the water outlet; or the top region of the immersion box body 1 communicated to both the water inlet and the water outlet; or the middle region of the immersion box body 1 communicated to both the water inlet and the water outlet. Of course, a height of the water inlet of the heat exchanger 3 generally needs to be greater than or equal to a height of the water outlet of the heat exchanger 3.

In order to facilitate to achieve the communication between the water inlet of the heat exchanger 3 and the water outlet of the heat exchanger 3 and in the present embodiment, the water inlet of the heat exchanger 3 is communicated to the top of the immersion box body 1 through a water inlet pipeline 31, and the water outlet of the heat exchanger 3 is communicated to the bottom of the immersion box body 1 through a water outlet pipeline 32. Generally, the water inlet pipeline 31 and the water outlet pipeline 32 may be made of flexible pipes or rigid pipes with a good sealing property. Correspondingly, the first driven impeller 52 may be mounted in the water inlet pipeline 31 to pump the single-phase coolant from the immersion box body 1 into the heat exchanger 3 under the action of a pressure difference.

Of course, the water inlet of the heat exchanger 3 and the water outlet of the heat exchanger 3 may also be connected to the immersion box body 1 through components such as a communicating element and a connection valve.

In order to improve the heat exchange efficiency of the heat exchanger 3 for the single-phase coolant, in the present embodiment, a bent coil 33 is arranged in the heat exchanger 3. A pipe orifice of one end of the bent coil 33 is communicated to a pipe orifice of the water inlet pipeline 31; and a pipe orifice of the other end of the bent coil 33 is communicated to a pipe orifice of the water outlet pipeline 32. A plurality of zigzag U-shaped pipe portions communicated to each other end to end are arranged in a middle region of the bent coil 33, so as to increase a total length of the bent coil 33 as much as possible, thereby heat exchange time between the single-phase coolant and an external cooling medium is prolonged as much as possible and a contact area is enlarged as much as possible. Of course, a medium flowing channel dedicated to the flowing of the external cooling medium such as air, water, and ethylene glycol is further disposed in the heat exchanger 3.

Further, a plurality of heat dissipation fins may be further arranged on the bent coil 33 to further enlarge a heat dissipation area of the bent coil 33, thereby heat dissipation of the single-phase coolant is accelerated and the heat dissipation efficiency of the single-phase coolant is improved.

In order to facilitate to make the external cooling medium enter the medium flowing channel of the heat exchanger 3, in the present embodiment, a cooling medium inlet pipe 34 is further communicated to the heat exchanger 3 to import the external cooling medium from a source into the medium flowing channel of the heat exchanger 3. Similarly, in order to facilitate to make the external cooling medium flow out of the medium flowing channel of the heat exchanger 3, in the present embodiment, a cooling medium outlet pipe is further communicated to the heat exchanger 3 to export the external cooling medium out of the medium flowing channel of the heat exchanger 3. In this way, through the actions of the cooling medium inlet pipe 34 and the cooling medium outlet pipe 35, it may be achieved that the external cooling medium may circulate and flow in the heat exchanger 3 and dissipate heat from the bent coil 33 during the flowing, thereby the heat of the single-phase coolant is continuously taken away.

Further, considering that when the external cooling medium flows inside the heat exchanger 3, the external cooling medium may cyclically flow for long time only after being driven by power. In the related art, a power component such as a pump is usually additionally configured for driving, resulting in a further increase in energy consumption. For this, in the present embodiment, a second driving assembly 6 is added to achieve pumpless circulation driving on the external cooling medium through the second driving assembly 6. This is similar to the first driving assembly 5 mentioned above.

The second driving assembly 6 is a split structure, mainly including a second driving impeller 61, a second driven impeller 62, and a second transmission component 63. The second driving impeller 61 is also mounted in the circulating pipe 4 and maintains a freedom of rotation motion. When the gaseous two-phase coolant flows through the circulating pipe 4, the gaseous two-phase coolant forms a wind driving effect on both the first driving impeller 51 and the second driving impeller 61, to drive the second driving impeller 61 to rotate. The second driven impeller 62 is mounted in the cooling medium inlet pipe 34 and also maintains a freedom of rotation motion. The second transmission component 63 is connected between the second driving impeller 61 and the second driven impeller 62, and is mainly configured to transfer the rotation motion of the second driving impeller 61 to the second driven impeller 62, so as to drive the second driven impeller 62 to rotate synchronously when the second driving impeller 61 rotates. Since the second driven impeller 62 is mounted in the cooling medium inlet pipe 34, the rotation motion of the second driven impeller 62 achieves a pumping driving effect on the external cooling medium in the cooling medium inlet pipe 34, to drive the external cooling medium to continuously circulate and flow in the heat exchanger 3 through the second driven impeller 62. In this way, there is no need to mount an additional power component such as a pump, and the heat of the server nodes a may be further used as kinetic energy to achieve cyclic driving on the external cooling medium through the second driving assembly 6.

Further, considering that both the first driving impeller 51 and the second driving impeller 61 are mounted on the circulating pipe 4, in an embodiment regarding the first driving impeller and the second driving impeller, the first driving impeller 51 and the second driving impeller 61 are connected in series, namely, the first driving impeller 51 and the second driving impeller 61 are connected in series on the circulating pipe 4, and the gaseous two-phase coolant passes through the first driving impeller 51 and the second driving impeller 61 in sequence to drive the first driving impeller 51 and the second driving impeller 61 to rotate in sequence. A certain turn-on time difference exists between the first driving impeller and the second driving impeller.

Figure 2:
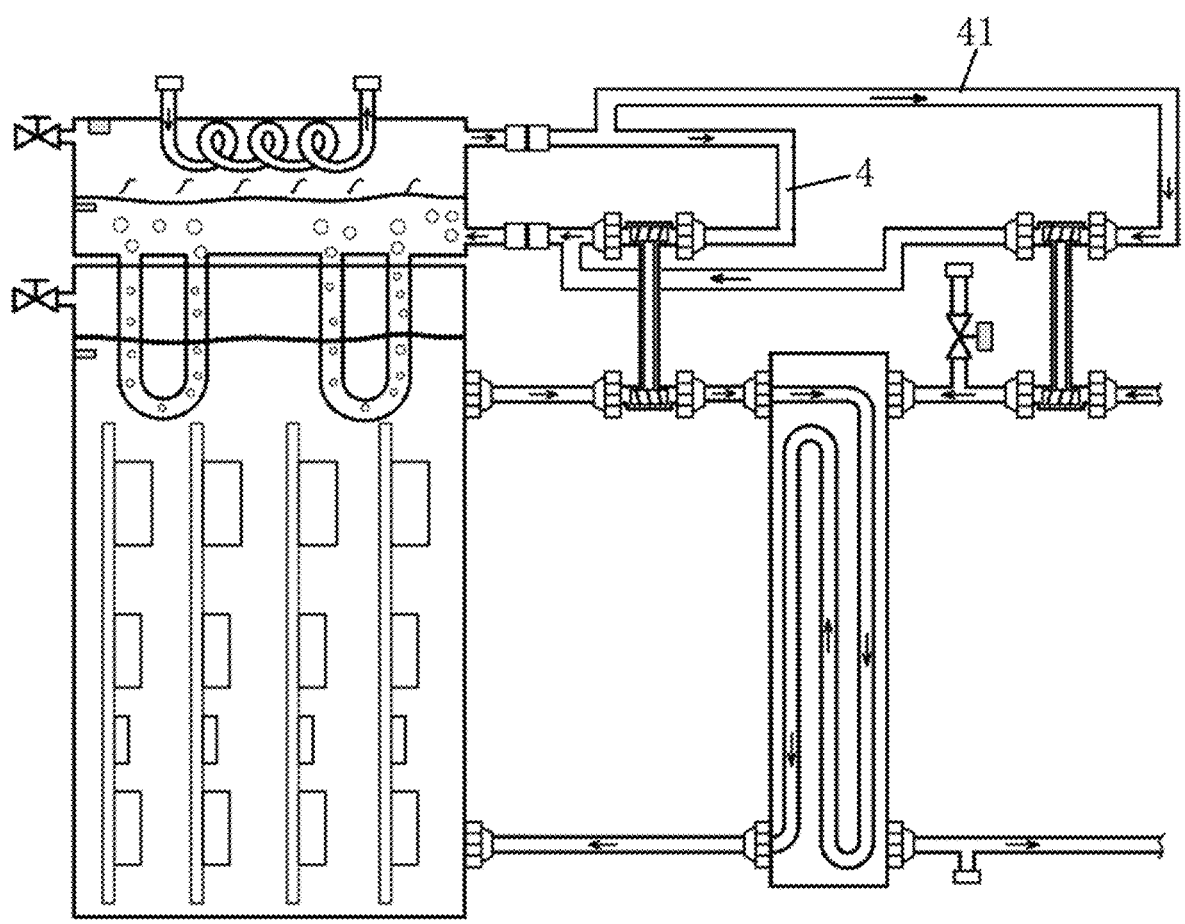
FIG. 2 is a diagram of an entire structure of a waste heat recovery system according to another implementation of by the present application.

As shown in FIG. 2, FIG. 2 is a schematic diagram of an entire structure of a waste heat recovery system according to another implementation of by the present application.

In another embodiment regarding the first driving impeller 51 and the second driving impeller 61, the first driving impeller 51 and the second driving impeller 61 are connected in parallel, namely, the first driving impeller 51 and the second driving impeller 61 are connected in parallel on the circulating pipe 4. At this moment, in the present embodiment, a circulating branch pipe 41 is connected in parallel to the circulating pipe 4, which is equivalent to a bypass branch of a main loop (the circulating pipe 4). The first driving impeller 51 is mounted on the main loop, and the second driving impeller 61 is mounted on the bypass branch. In this way, the gaseous two-phase coolant will simultaneously enter the circulating pipe 4 and the circulating branch pipe 41, and theoretically synchronously drive the first driving impeller 51 and the second driving impeller 61 to rotate. Theoretically, the first driving impeller 51 and the second driving impeller 61 are turned on simultaneously, so that the single-phase coolant and the external cooling medium may flow almost simultaneously into the heat exchanger 3, thereby a waste of cold is avoided.

In an embodiment regarding the first transmission component 53, the first transmission component 53 may be in the form of a transmission shaft, namely, a first transmission shaft. Meanwhile, the first driving impeller 51 is connected to a position of one end of the first transmission shaft, and the first driven impeller 52 is connected to a position of the other end of the first transmission shaft. In this way, it is convenient to synchronously transmit the rotation motion of the first driving impeller 51 to the first driven impeller 52 through a transmission effect of the first transmission shaft, thereby synchronous rotation motion between the first driving impeller 51 and the first driven impeller 52 is ensured.

Similarly, in an embodiment regarding the second transmission component 63, the second transmission component 63 may be in the form of a transmission shaft, namely, a second transmission shaft. Meanwhile, the second driving impeller 61 is connected to a position of one end of the second transmission shaft, and the second driven impeller 62 is connected to a position of the other end of the second transmission shaft. In this way, it is convenient to synchronously transmit the rotation motion of the second driving impeller 61 to the second driven impeller 62 through a transmission effect of the second transmission shaft, thereby synchronous rotation motion between the second driving impeller 61 and the second driven impeller 62 is ensured.

Of course, the above first transmission component 53 and the above second transmission component 63 are not limited to the form of the transmission shafts. Other forms such as a shaft coupler or a more complex transmission mechanism such as a gear transmission mechanism may also be used.

Considering that if the amount of heat generated by the server nodes a increases, the temperature of the single-phase coolant will rise rapidly, which accelerates the boiling and vaporization of the two-phase coolant, increases the amount of the gas inside the evaporation box body 2, and increases the pressure, thus the rotation speeds of the first driving impeller 51 and the second driving impeller 61 are increased. Then, the rotation speeds of the first driven impeller 52 and the second driven impeller 62 are increased through the first transmission component 53 and the second transmission component 63, respectively, thereby the flow velocity of the single-phase coolant and the flow velocity of the external cooling medium are increased, and the heat dissipation on the server nodes a are ultimately accelerated. On the contrary, as the temperature of the single-phase coolant decreases, the boiling and vaporization of the two-phase coolant are weakened, the amount of the gas inside the evaporation box body 2 is reduced, and the pressure is reduced, thereby the rotation speeds of the first driven impeller 52 and the second driven impeller 62 are reduced. The heat exchange between the single-phase coolant and the external cooling medium are further weakened, and the heat dissipation on the server nodes a ultimately slows down.

As mentioned above, when the temperatures of the server nodes a are high, the amount of the gas inside the evaporation box body 2 increases dramatically. In order to prevent an accident caused by a high gas pressure, a condenser 7 is added in the present embodiment. The condenser 7 is mounted in the evaporation box body 2 to mainly condense a part of the gaseous two-phase coolant when a gas pressure of gas generated by evaporation of the two-phase coolant exceeds a safety threshold, so as to condense some gaseous two-phase coolant into an aqueous two-phase coolant to properly reduce the gas pressure to make the gas pressure in a safety threshold range.

Figure 3:
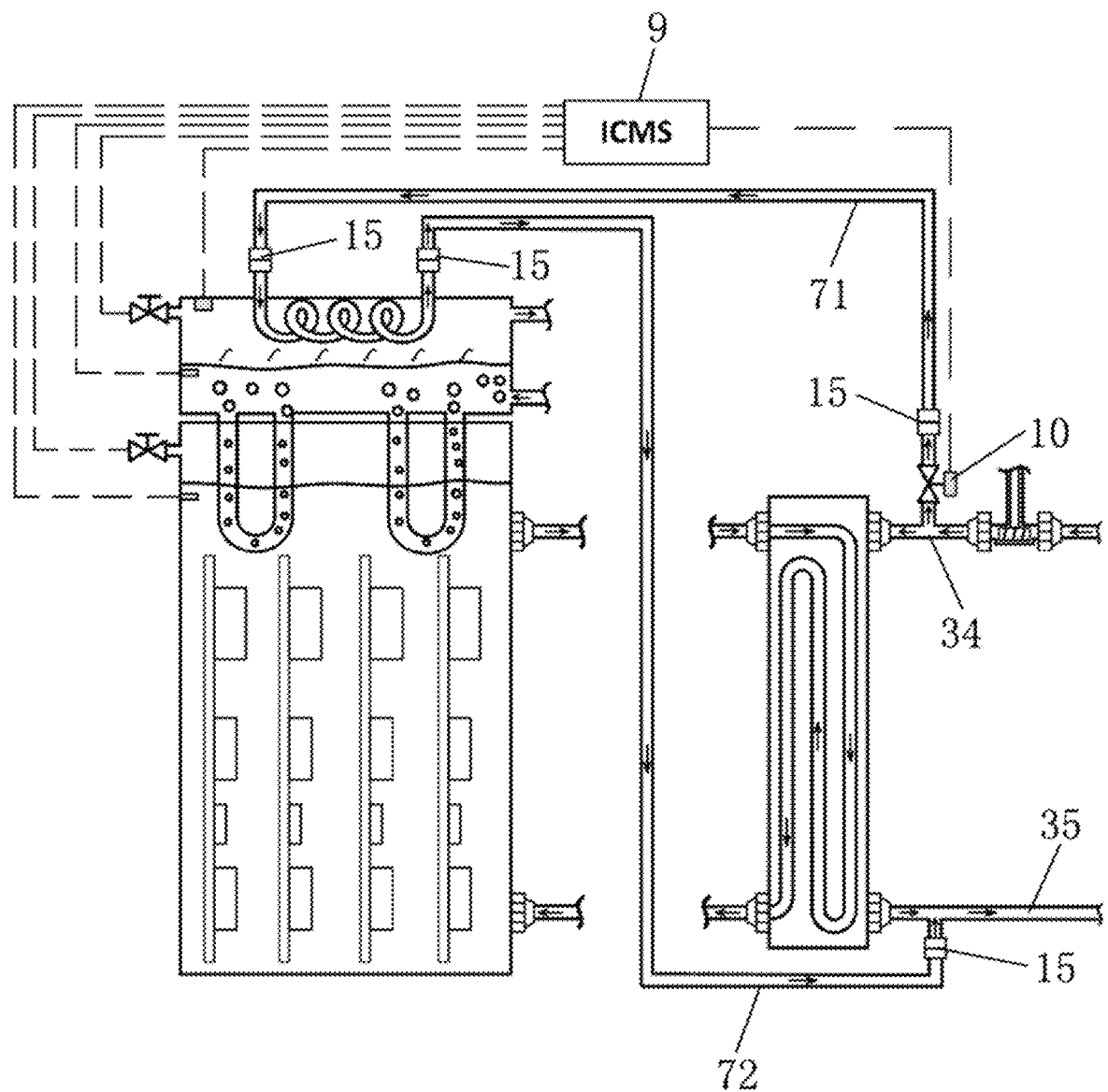
FIG. 3 is a diagram of a connection structure between a water inlet of a condenser and a water outlet of the condenser shown in FIG. 1.

As shown in FIG. 3, FIG. 3 is a schematic diagram of a connection structure between a water inlet of a condenser 7 and a water outlet of the condenser 7 shown in FIG. 1.

Further, in order to facilitate to maintain a condensation effect of the condenser 7, a condensate water inlet pipe 71 and a condensate water return pipe 72 are added in the present embodiment. A pipe orifice of one end of the condensate water inlet pipe 71 is communicated to a water inlet of the condenser 7, and a pipe orifice of the other end of the condensate water inlet pipe 71 is communicated to the cooling medium inlet pipe 34. Meanwhile, a pipe orifice of one end of the condensate water return pipe 72 is communicated to a water outlet of the condenser 7, and a pipe orifice of the other end of the condensate water return pipe 72 is communicated to the cooling medium outlet pipe 35. This setting is equivalent to exporting an external cooling medium supplied to the condenser 7 for use, so as to use a part of the external cooling medium to condense the excess gaseous two-phase coolant.

In addition, in order to achieve automatic control and adjustment on the gas pressure inside the evaporation box body 2, a pressure sensor 8, a controller 9 and an electromagnetic throttle valve 10 are added in the present embodiment. The pressure sensor 8 is mounted inside evaporation box body 2 and is mainly configured to detect the gas pressure inside the evaporation box body 2. The electromagnetic throttle valve 10 is mounted on the condensate water inlet pipe 71 and is mainly configured to control an incoming water flow rate of the condensate water inlet pipe 71, to control a flow rate of the external cooling medium entering the condenser 7, thereby the condensation efficiency is controlled. The controller 9 maintains signal connection with the pressure sensor 8 and the electromagnetic throttle valve 10 and is mainly configured to: receive detection data of the pressure sensor 8 and control a throttle opening degree of the electromagnetic throttle valve 10 according to the detection data, thereby the condensation efficiency of the condenser 7 is controlled.

Generally, an Immersion Cooling Management System (ICMS) may be uses as the controller 9.

Furthermore, in order to ensure long-term stable operation of the system, a liquid level of the single-phase coolant inside the immersion box body 1 also needs to be automatically monitored. In view of this, a first liquid level sensor 11 is added in the present embodiment. The first liquid level sensor 11 is mounted in the immersion box body 1 and is mainly configured to detect the liquid level of the single-phase coolant. Meanwhile, the first liquid level sensor 11 is in signal connection to the controller 9 and may provide a real-time feedback of a liquid level detection value to the controller 9. When the detection value is less than a safety threshold, an alarm instruction is triggered, so that alarm devices sounds an alarm to the operation and maintenance personnel, thereby the operation and maintenance personnel is reminded to check and handle with this situation and eliminate a leakage fault.

Further, in order to automatically replenish the single-phase coolant when the liquid level of the single-phase coolant is low and ensure sufficient single-phase coolant, a first electromagnetic replenishment valve 12 is added in the present embodiment. The first electromagnetic replenishment valve 12 is mounted on the immersion box body 1, and is usually located at a top of a side wall of the immersion box body 1. The first electromagnetic replenishment valve 12 is in signal connection to the controller 9. When the first liquid level sensor 11 detects that the liquid level is less than the safety threshold, the controller 9 simultaneously controls that the first electromagnetic replenishment valve 12 is opened to timely replenish the single-phase coolant into the immersion box body 1.

Similarly, in order to ensure long-term stable operation of the system, a liquid level of the two-phase coolant inside the evaporation box body 2 also needs to be automatically monitored at the same time. In view of this, a second liquid level sensor 13 is added in the present embodiment. The second liquid level sensor 13 is mounted in the evaporation box body 2 and is mainly configured to detect the liquid level of the two-phase coolant. Meanwhile, the second liquid level sensor 13 is in signal connection to the controller 9 and may provide a real-time feedback of a liquid level detection value of the second liquid level sensor 13 to the controller 9. When the detection value is less than a safety threshold, an alarm instruction is triggered, so that alarm devices sounds an alarm to operation and maintenance personnel, thereby the operation and maintenance personnel is reminded to check and handle with this situation and eliminate a leakage fault.

Further, in order to automatically replenish the two-phase coolant when the liquid level is low and ensure sufficient two-phase coolant, a second electromagnetic replenishment valve 14 is added in the present embodiment. The second electromagnetic replenishment valve 14 is mounted on the evaporation box body 2, and is usually located at a top of a side wall of the evaporation box body 2. The second electromagnetic replenishment valve 14 is in signal connection to the controller 9. When the second liquid level sensor 13 detects that the liquid level is less than the safety threshold, the controller 9 simultaneously controls that the valve of the second electromagnetic replenishment valve 14 is opened to timely replenish the two-phase coolant into the evaporation box body 2.

In addition, considering that the server nodes a inside the immersion box body 1 may need to be added or removed at any time, for this, it is usually necessary to first remove the evaporation box body 2 to facilitate a lifting operation on the server nodes a. In view of this, in the present embodiment, pipe orifices at two ends of the circulating pipe 4 and the evaporation box body 2 are communicated to each other through quick-release connectors 15; the condensate water inlet pipe 71 and the water inlet of the condenser 7 are communicated to each other through a quick-release connector 15; the condensate water inlet pipe 71 and the cooling medium inlet pipe 34 are communicated to each other through a quick-release connector 15; the condensate water return pipe 72 and the water outlet of the condenser 7 are communicated to each other through a quick-release connector 15; and the condensate water return pipe 72 and the cooling medium outlet pipe 35 are communicated to each other through a quick-release connector 15. Each quick-release connector 15 is a double-end self-sealed connector that may be conveniently connected, mounted, and removed. Therefore, when it is necessary to remove the evaporation box body 2, only the quick-release connectors 15 need to be removed, and the evaporation box body 2 may be conveniently separated from other components and then removed.

An immersion liquid-cooling server is further provided in the present embodiment, which mainly includes a plurality of server nodes a and a waste heat recovery system. Contents of the waste heat recovery system is the same as the above related content, and will not be elaborated here.

The above explanations of the disclosed embodiments enable those skilled in the art to implement or use the present application. The various modifications to these embodiments will be apparent to a person skilled in the art, and the general principles defined herein may be implemented in other embodiments without departing from the spirit or scope of the present application. Thus, the present application is not limited to these embodiments shown herein, but accords with the broadest scope consistent with the principles and novel features disclosed herein.

The invention claimed is:

1. A waste heat recovery system, comprising an immersion box body, an evaporation box body, a heat exchanger, a circulating pipe and a first driving assembly;

wherein the immersion box body is filled with a single-phase coolant for immersed mounting of server nodes;

the evaporation box body is filled with a two-phase coolant capable of generating gas-liquid phase change, and the evaporation box body is provided with an extending portion; and the extending portion extends into the immersion box body and is in contact with the single-phase coolant;

a water inlet of the heat exchanger and a water outlet of the heat exchanger are respectively communicated to different positions of the immersion box body to dissipate heat from the single-phase coolant;

a pipe orifice of one end of the circulating pipe is communicated to a bottom of the evaporation box body, and a pipe orifice of the other end of the circulating pipe is communicated to a top of the evaporation box body; and the first driving assembly comprises a first driving impeller mounted in the circulating pipe, a first driven impeller mounted in a pipeline between the water inlet of the heat exchanger and the immersion box body, and a first transmission component connected between the first driving impeller and the first driven impeller.

2. The waste heat recovery system according to claim 1, wherein a plurality of mounting partitions that extend vertically are vertically arranged in the immersion box body; and the server nodes are mounted in a vertical posture on the mounting partitions.

3. The waste heat recovery system according to claim 2, wherein each mounting partition is provided with a guiding sliding rail, and the server nodes are slidably mounted on the guiding sliding rails.

4. The waste heat recovery system according to claim 1, wherein both the immersion box body and the evaporation box body are rectangular box bodies.

5. The waste heat recovery system according to claim 4, wherein the evaporation box body is mounted on a top surface of the immersion box body, and the extending portion is arranged on a top plate of the immersion box body in a penetrating manner and extends to be in contact with a liquid level region of the single-phase coolant in the immersion box body.

6. The waste heat recovery system according to claim 4, wherein the evaporation box body is mounted on a side surface of the immersion box body, and the extending portion is arranged on a side wall of the immersion box body in a penetrating manner and extends to be in contact with a middle region of the single-phase coolant in the immersion box body.

7. The waste heat recovery system according to claim 1, wherein the evaporation box body is provided with a plurality of extending portions, and the extending portions are uniformly distributed on a mounting surface of the evaporation box body.

8. The waste heat recovery system according to claim 7, wherein the extending portions are U-shaped pipes or straight pipes.

9. The waste heat recovery system according to claim 1, wherein the water inlet of the heat exchanger is communicated to a top of the immersion box body, and the water outlet of the heat exchanger is communicated to a bottom of the immersion box body.

10. The waste heat recovery system according to claim 9, wherein the water inlet of the heat exchanger is communicated to the top of the immersion box body through a water inlet pipeline, and the first driven impeller is mounted in the water inlet pipeline; and the water outlet of the heat exchanger is communicated to the bottom of the immersion box body through a water outlet pipeline.

11. The waste heat recovery system according to claim 10, wherein a bent coil is arranged in the heat exchanger; one end of the bent coil is communicated to the water inlet pipeline; and the other end of the bent coil is communicated to the water outlet pipeline.

12. The waste heat recovery system according to claim 11, wherein the heat exchanger is further communicated with a cooling medium inlet pipe and a cooling medium outlet pipe to allow an external cooling medium to flow through the heat exchanger and dissipate heat from the bent coil.

13. The waste heat recovery system according to claim 12, further comprising a second driving assembly, wherein the second driving assembly comprises a second driving impeller mounted in the circulating pipe, a second driven impeller mounted in the cooling medium inlet pipe, and a second transmission component connected between the second driving impeller and the second driven impeller.

14. The waste heat recovery system according to claim 1, wherein the first transmission component is a first transmission shaft; the first driving impeller is connected to one end of the first transmission shaft; and the first driven impeller is connected to the other end of the first transmission shaft.

15. The waste heat recovery system according to claim 13, wherein the second transmission component is a second transmission shaft; the second driving impeller is connected to one end of the second transmission shaft; and the second driven impeller is connected to the other end of the second transmission shaft.

16. The waste heat recovery system according to claim 13, wherein a circulating branch pipe is connected in parallel to the circulating pipe, and the second driving impeller is mounted in the circulating branch pipe.

17. The waste heat recovery system according to claim 12, further comprising a condenser mounted in the evaporation box body to condense a part of a gaseous two-phase coolant in response to a gas pressure of gas generated by evaporation of the two-phase coolant exceeding a safety threshold.

18. The waste heat recovery system according to claim 17, wherein a water inlet of the condenser is communicated to the cooling medium inlet pipe through a condensate water inlet pipe, and a water outlet of the condenser is communicated to the cooling medium outlet pipe through a condensate water return pipe.

19. The waste heat recovery system according to claim 18, further comprising a pressure sensor configured to detect a gas pressure inside the evaporation box body, and a controller that is in signal connection to the pressure sensor, wherein the condensate water inlet pipe is provided with an electromagnetic throttle valve that is in signal connection to the controller to control a throttle opening degree of the electromagnetic throttle valve according to a feedback result of the pressure sensor.

20. An immersion liquid-cooling server, comprising the server nodes, further comprising the waste heat recovery system according to claim 1.

* * * * *